US006980003B2

(12) United States Patent
Avdievich et al.

(10) Patent No.: US 6,980,003 B2
(45) Date of Patent: Dec. 27, 2005

(54) OPEN HALF VOLUME QUADRATURE TRANSVERSE ELECTROMAGNETIC COIL FOR HIGH FIELD MAGNETIC RESONANCE IMAGING

(75) Inventors: Nikolai Avdievich, Bronx, NY (US); Alexey Peshkovsky, New York, NY (US); Richard Kennan, Rye, NY (US)

(73) Assignee: Albert Einstein College of Medicine of Yeshiva University, Bronx, NY (US)

( * ) Notice: Subject to any disclaimer, the term of this patent is extended or adjusted under 35 U.S.C. 154(b) by 0 days.

(21) Appl. No.: 10/845,953

(22) Filed: May 14, 2004

(65) Prior Publication Data

US 2005/0253581 A1 Nov. 17, 2005

(51) Int. Cl.$^7$ .............................................. G01V 3/00
(52) U.S. Cl. ..................................... 324/318; 324/309
(58) Field of Search ................................ 324/318, 319, 324/322, 309, 307, 300; 600/418; 128/653; 343/725

(56) References Cited

U.S. PATENT DOCUMENTS

| 4,751,464 A | | 6/1988 | Bridges | |
|---|---|---|---|---|
| 5,210,494 A | * | 5/1993 | Brunner et al. | 324/309 |
| 5,744,957 A | | 4/1998 | Vaughan, Jr. | |
| 5,886,596 A | | 3/1999 | Vaughan, Jr. | |
| 6,384,603 B2 | * | 5/2002 | Hoult et al. | 324/328 |
| 6,812,902 B2 | * | 11/2004 | Rossman et al. | 343/725 |
| 2004/0030238 A1 | * | 2/2004 | Vaughan | 600/418 |

OTHER PUBLICATIONS

Vaughan T, Snyder C. Adriany G, Bolinger L, Liu H, Stolpen A, Ugurbil K. The Technology and Techniques of 4T Body Imaging. Proc ISMRM, 11th Meeting, Toronto, Canada 2003, p. 425.

Ballon D, Graham MC, Miodovnik S, Koutcher JA. A 64 MHz Half-Birdcage Resonator for Clinical Imaging. J. Magn Reson 1990;90:131-140.

Oh CH, Kim SK, Yang YJ, Ahn CB. Novel Type of Quadrature Breast RF Coil with a Ladder Structure. Proc ISMRM, 6th Meeting, Sydney, Australia 1998, p. 2025.

Fujita H, Braum WO, Shvartsman SM, Brown RW, Reisker TJ, Molyneaux DA, Morich MA. An Optimized Open Quadrature RF Surface Coil. Proc ISMRM, 6th Meeting Sydney, Australia 1998, p. 645.

Jin J. Electromagnetic Analysis and Design in Magnetic Resonance Imaging. Neuman MR, editor. Boca Raton: CRC Press; 1999, pp 157-164.

(Continued)

*Primary Examiner*—Brij B. Shrivastav
(74) *Attorney, Agent, or Firm*—Amster, Rothstein & Ebenstein LLP

(57) ABSTRACT

A half-volume quadrature TEM coil high field (>3 T) imaging applications. This novel coil produces a sufficiently large homogeneous $B_1$ field region for the use as a volume coil. It provides superior transmission efficiency, resulting in significantly lower power deposition, as well as greater sensitivity and improved patient comfort and accessibility compared with conventional full-volume coils. Additionally this coil compensates the RF penetration artifact that distorts high-field images recorded with linear surface and volume coils. These advantages make it potentially possible to apply the device as an efficient transmit/receive body coil at high fields, where the use of the full-volume coils is complicated by the excessive power deposition and low sensitivity.

12 Claims, 6 Drawing Sheets

OTHER PUBLICATIONS

Vaughan JT, Hetherington HP, Pohast GM. A Toroidal Cavity Coil for High Frequency Clinical NMR. Proc, SMR, 3rd Annual Meeting, Nice, France 1995; 2:996.

Adriany G. Yacoub E, Tkac I, Anderson P, Merkle H, Vaughan JT, Shielded Surface Coils and Halfvolume Cavity Resonators for Imaging and Spectroscopy Applications at 7 Tesla. Proc ISMRM, 8th Meeting, Denver, CO 2000, p. 563.

Chen C-N, Hoult DI, Sank VJ. Quadrature Detection Coils—A Further Sqrt(2) Improvement in Sensitivity. J. Magn Reson 1983;54:324-327.

Glover GH, Hayes CE, Pelc NJ, Edelstein WA, Mueller OM, Hart HR, Hardy CJ, O'Donnell M, Barber WD. Comparison of Linear and Circular Polarization for Magnetic Resonance Imaging. J. Magn Reson 1985;64:255-270.

Hoult DI. Sensitivity and Power Deposition in a High-Field Imaging Experiment, J. Magn Reson Imag 2000;12:46-67.

Vaughan JT, Hetherington HP, Otu JO, Pan JW, Pohost GM. Hight Frequency Volume Coils for Clinical NMR Imaging and Spectroscopy. Magn Reson Med 1994;32:206-218.

Vaughan JT, Garwood M. Collins CM, Liu W. Delabarre L, Adriany G. Andersen P. Merkle H, Goebel R, Smith MB, Ugurbil K. 7T vs. 4T:RF Power, Homogeneity, and Signal-to-Noise Comparison in Head Images. Magn Reson in Med 2001:46:24-30.

Vaughn JT. The Head Cradle: An Open Faced, High Performance TEM Coil. Proc ISMRM, 9th Meeting, Glasgow, Scotland 2001, p. 15.

Tropp J. Mutual Inductance in the Bird-Cage Resonator. J. Magn Reson 1997;126:9-17.

Hoult DI. The Principle of Reciprocity in Signal Strength Calculations—A Mathematical Guide. Concepts Magn Reson 2000:12(4):173-187.

Hayes CE, Edelstein WA, Schenick JF, Mueller OM, And Eash M, An Efficient, highly homogeneous radiofrequency coil for whole-body imaging at 1.5 T.J. Magn. Reson 1985; 63:622-628.

Chen C-N, Hoult DI. Biomedical Magnetic Resonance Technology. Mould RF, editor. Bristol and Philadelphia: Institute of Physics Publishing; 1989, pp 133-140.

Avdievich NI, Krymov VN, Hetherington HP, Modified Perturbation Method for Transverse Electromagnetic (TEM) Coil Tuning and Evaluation. Magn Reson Med 2003;50:13-18.

Bogdanov G. Ludwig R. Coupled Miscrostrip Line Transverse Electromagnetic resonator Model for High-Field Magnetic Resonance Imaging. Magn Res Med 47, 579-593, 2002.

* cited by examiner

OPEN HALF VOLUME QUADRATURE TRANSVERSE ELECTROMAGNETIC COIL FOR HIGH FIELD MAGNETIC RESONANCE IMAGING

FIELD OF THE INVENTION

The present invention is in the field of magnetic resonance spectroscopy and imaging and more specifically, to coils for high-field magnetic resonance imaging.

BACKGROUND OF THE INVENTION

In the past, the nuclear magnetic resonance (NMR) and electron spin resonance (ESR) phenomenon have been utilized by structural chemists and physicists to study, in vitro, the molecular structure of atoms and molecules. Typically, NMR and ESR spectrometers utilized for this purpose were designed to accommodate relatively small samples of the substance to be studied.

More recently, however, NMR has been developed into an imaging modality utilized to obtain images of anatomical features of live human subjects, for example. Such images depicting parameters associated with nuclear spins (typically hydrogen protons associated with water in tissue) may be of medical diagnostic value in determining the state of health of tissue in the region examined. NMR techniques have also been extended to in vivo spectroscopy of such elements as phosphorus and carbon, for example, providing researchers with the tools, for the first time, to study chemical processes in a living organism. The use of NMR to produce images and spectroscopic studies of the human body has necessitated the use of specifically designed system components, such as the magnet, gradient and RF coils.

By way of background, the nuclear magnetic resonance phenomenon occurs in atomic nuclei having an odd number of protons and/or neutrons (i.e., a quantum mechanical asymmetry in the nucleus). Due to the spin of the protons and neutrons, each such nucleus exhibits a magnetic moment, such that, when a sample composed of such nuclei is placed in a static, homogeneous magnetic field, $B_0$, a greater number of nuclear-magnetic moments align with the field to produce a net macroscopic magnetization M in the direction of the field. Under the influence of the magnetic field $B_0$, the magnetic moments precess about the axis of the field at a frequency which is dependent on the strength of the applied magnetic field and on the characteristics of the nuclei. The angular precession frequency, w, also referred to as the Larmor Frequency, is given by the equation $w=g\,B$, in which g is the gyromagnetic ratio (which is constant for each NMR isotope) and wherein B is the magnetic field ($B_0$ plus other fields) acting upon the nuclear spins. It will be thus apparent that the resonant frequency is dependent on the strength of the magnetic field in which the sample is positioned.

The orientation of magnetization M, normally directed along the magnetic field $B_0$, may be perturbed by the application of magnetic fields oscillating at or near the Larmor frequency. Typically, such magnetic fields designated $B_1$ are applied orthogonal to the direction of magnetization M by means of radio-frequency pulses through a coil connected to radio-frequency-transmitting apparatus. Magnetization M rotates about the direction of the $B_1$ field. In NMR, it is typically desired to apply RF pulses of sufficient magnitude and duration to rotate magnetization M into a plane perpendicular to the direction of the $B_0$ field. This plane is commonly referred to as the transverse plane.

Upon cessation of the RF excitation, the nuclear moments rotated into the transverse plane begin to realign with the $B_0$ field by a variety of physical processes. During this realignment process, the nuclear moments emit radio-frequency signals, termed the NMR signals, which are characteristic of the magnetic field and of the particular chemical environment in which the nuclei are situated. The same or a second RF coil may be used to receive the signals emitted from the nuclei. In NMR imaging applications, the NMR signals are observed in the presence of magnetic-field gradients which are utilized to encode spatial information into the NMR signal. This information is later used to reconstruct images of the object studied in a manner well known to those skilled in the art.

High-field imaging ($\geq 3$ T), while being advantageous for increased signal-to-noise ratios (SNR), is a challenging task that requires special instrumentation. Constructing efficient volume coils for high-field body imaging is difficult due to low SNR and significant power deposition factors associated with the large fields-of-view (FOV) of these devices. As a result, only limited feasibility assessment efforts have been reported. On the other hand, surface coils, which have restricted FOVs and, higher efficiencies and lower power deposition factors, do not provide homogeneous RF magnetic fields ($B_1$ fields) needed in many experiments. Alternative coil designs for high-field MRI imaging applications, therefore, become highly desirable.

For purposes of this application the term open as it applies to volume coils is intended to refer to those coils which are sufficiently open to avoid magnetic or electrical coupling between the end resonant elements. The idea of constructing open volume MRI coils for imaging of large objects, such as a human body, has been explored previously for experiments at 1.5 T. Additionally, some attempts to construct open head coils of very different geometry have also been made for experiments at higher fields, for example U.S. Pat. No. 5,744,957 to Vaughan, hereby incorporated by reference. However, these attempts are based on a fundamentally different design. A number of imaging applications can be greatly benefited by the use of open volume coils. These devices provide sufficiently large homogeneous $B_1$ field regions, while maintaining higher efficiency and sensitivity as well as relatively low power deposition factors, because their FOVs are substantially reduced. They also improve patient comfort and accessibility, a feature that is especially important in functional magnetic resonance imaging (fMRI), where additional stimulation equipment is used inside volume coils.

It is preferable to operate volume coils in quadrature because of the transmission efficiency and the SNR increase by a factor of $2^{1/2}$. At high field strength, an additional benefit of quadrature operation is the reduction of RF penetration artifacts that distort images of conducting objects (such as a human body or head) which are most pronounced when linear devices are used. Quadrature coil operation is easily achieved in a full-volume coil by simultaneously driving a naturally occurring degenerate pair of modes. However, the situation is different for an open half-volume coil (TEM or birdcage), in which no frequency-degenerate modes naturally exist. To achieve quadrature operation, therefore, two orthogonal modes must be selected, explicitly made degenerate and independently driven.

TEM volume coils have become a well-established alternative to conventional birdcage designs for imaging at high fields due to a number of advantages. Because the inductances of the elements comprising birdcage coils increase with the coils' overall sizes, unreasonably low value capacitors are required to resonate the large body birdcage coils. Size scaling of TEM coils, on the other hand, is much easier, since the area of the elements comprising a TEM coil can be controlled by adjusting the distance between the coil's legs and its shield. Additional advantages of the TEM coils include absence of end ring currents and better sensitivity. While open half-volume linear and quadrature birdcage coils have been constructed in the past for low field (1.5 T) applications, successful development of similar TEM devices have not been reported. A partial solution was provided by removing a single top element in a 16-element TEM resonator. For the reasons discussed below this coil cannot be considered an open coil but is rather a closed full-volume coil in which the current distribution patterns became somewhat distorted by the removal of an element and could be compensated by appropriate adjustments to restore the full-volume coil quadrature operation.

Open half-volume coils, as compared with the closed full-volume devices, can provide significantly higher transmission efficiency because their FOVs are decreased approximately in half. The value of the RF magnetic field $B_1$ per unit of applied power can be obtained, according to:

$$\frac{B_1}{\sqrt{P}} \sim \sqrt{\frac{Q \cdot \eta}{\omega \cdot V_s}}$$

where P is the input power, Q is the coil's quality factor, $\omega$ is the resonance frequency, $\eta$ is the magnetic field filling factor and $V_s$ is the sample volume seen by the coil, directly related to the FOV of the coil. Thus, the decrease in the FOV leads to the increase in the transmit efficiency. Additionally, since it is easier to fit objects inside open coils, their magnetic field filling factors, $\eta$, are higher, leading to a further increase in the $B_1$ value according to the equation. Substantial SNR improvements are also achieved with these coils, in which a simultaneous increase in the detected signal strength and a reduction in the noise occur. The signal enhancement can be understood if one considers the reciprocity principle that states that the amount of signal picked up by the coil is proportional to the amount of the $B_1$ field produced per unit of the input power in the transmit mode. Furthermore, a noise reduction results from the smaller FOV of the open coils relative to conventional closed volume coils, which, when operated in receive mode, collect noise from the areas outside of the region of interest for the study.

A TEM coil consists of a number of identical coupled resonant elements producing several modes resonating at different frequencies. The number of modes in a chain of coupled elements is equal to the number of elements. In a closed TEM coil, some of the modes become degenerate and the number of distinct resonant frequencies is reduced. The second lowest resonance frequency of this coil corresponds to a frequency-degenerate pair of modes with currents flowing in the elements such that their amplitudes are modulated sinusoidally going from one rung to the next with one period over a 360° revolution by the azimuthal angle that defines the element. Such distribution of currents has been shown to create homogeneous $B_1$ fields inside the coil. Quadrature coil operation is easily achieved in a closed TEM coil by simultaneously driving these two orthogonal degenerate modes by connecting in series to two 90°-separated resonant elements, producing a circularly polarized homogeneous $B_1$ field.

Analogous to a typical closed TEM, the open TEM 10 shown in FIG. 1A, and having elements 1–7 can be viewed as a half-wave resonator where a standing wave is formed in the radial direction. There are, however, some very important differences between the mode current distributions in the elements forming these two types of coils. In a closed TEM coil, the current distributions are modulated sinusoidally going around the coil, such that an integer number of full periods fit for one complete revolution. In an open TEM coil, no coupling exists between the first and the last elements in the chain, so this boundary condition changes, requiring that an integer number of half-periods fit between the first and the last element. Modes are formed at different frequencies according to the number of the half-periods. Thus, the lowest frequency corresponds to zero half periods (currents in all elements are in phase), the second lowest corresponds to one half-period (here referred to as the surface mode of the coil), third lowest—to two half-periods or one period (here referred to as the butterfly mode of the coil), etc. FIG. 1B shows theoretical current distributions and $B_1$ patterns for the surface and the butterfly modes for each of elements 1–7. In a half-volume TEM coil no frequency-degenerate modes naturally exist. Therefore, to achieve quadrature operation, a completely different approach has to be taken, in which two orthogonal modes corresponding to the most homogeneous orthogonal $B_1$ fields appearing at neighboring frequencies (second and third lowest) are selected, explicitly made degenerate and independently driven.

As was mentioned above, attempts have been made in the past to create an open volume coil configuration by simply removing an element from a closed volume coil and relying on the adjustments made in the remaining elements to restore full-volume coil quadrature operation. This is possible because the orientation of the elements in a TEM coil is such that the through-space inductive coupling is still in effect when one element of a closed densely spaced TEM coil is removed. Therefore, this coil's operation was in principle the same as in a regular closed TEM coil, where the current distribution patterns became somewhat distorted by the removal of an element. That distortion could be compensated by appropriate adjustments of other elements to restore the closed full-volume coil quadrature operation, and quadrature driving of two 90°-separated resonant elements still could be applied. However, removing more than one element would substantially decrease inductive interaction between the two ending elements and change the boundary conditions from a closed coil state (requiring an integer number of full periods of the sinusoidal current distribution around the coil) to an open state (requiring a integer number of the half-periods). Completely different modes would emerge as a result. Therefore, the "closed coil" state cannot be restored by simple adjustments in the elements in this case, making it impossible to utilize quadrature driving as in closed full-volume coils.

Taken against this background and the history of development in this field, a need exists for an appropriately driven quadrature half-volume TEM coil.

SUMMARY OF THE INVENTION

The present invention is a half-volume TEM coil for high field imaging applications (>3 T). The coil design described herein allows a sufficiently large homogeneous $B_1$ region for the use as a volume coil and provides the following advan tages over the conventional closed full-volume volume coil designs:

Greater transmission efficiency resulting in lower power deposition.

Greater SNR.

Superior patient comfort and accessibility.

The listed advantages make it possible to apply the device as an efficient body coil at high fields.

According to an embodiment of the present invention, an open volume quadrature transverse electromagnetic coil is disclosed having a plurality of inductively coupled resonant transmission line elements adapted to be driven to resonate in a first mode and a second mode. At least one of the transmission line elements is located within a nodal point of one of the modes. A quadrature driver circuit operatively associated with said transmission line elements drives the coil in both modes simultaneously so that for the transmission line element located in the node of one mode, no current is induced in that transmission line element due to driving in that mode, and the other mode is driven from that element.

According to another aspect of the present invention, the above described first and second modes are a surface mode and a butterfly mode.

According to another aspect of the present invention, the coil is driven in said surface mode in such a manner to maintain approximately a 180 degree phase shift between said first and last elements.

According to yet another aspect of the present invention, the surface mode and the butterfly mode are be driven and tuned independently.

According to still another aspect of the present invention, the quadrature driver circuit includes a symmetrized matching network for driving said coil in the surface mode.

According to another aspect of the present invention, the butterfly mode is driven at an elements located within a nodal point of the surface mode.

According to yet another aspect of the present invention, the coil has seven elements, a first and last element and a center element, wherein the center element is located within a nodal point.

According to still another aspect of the present invention, the center element is located within a nodal point associated with the surface mode, and the butterfly mode is driven from the center element.

According to still another aspect of the present invention, the coil is comprised of nine elements, having a center element located within a nodal point of one mode such as the surface mode.

According to another aspect of the present invention, at least two of the nine elements other than the center element are located within nodal points associated with the butterfly mode.

BRIEF DESCRIPTION OF THE DRAWINGS

FIG. 6, right panel, is a $B_1$ map of the transaxial slice recorded in FIG. 6, left panel, using an embodiment of the present invention.

DETAILED DESCRIPTION OF THE PREFERRED EMBODIMENT

In accordance with the foregoing summary, the following presents a detailed description of the preferred embodiment of the invention that is currently considered to be the best mode.

A prototype of the present invention has been built and tested. A seven-element half-volume TEM coil with 20 cm inside diameter, 20 cm length and 26 cm shield diameter was constructed for the 4 T application. The diameter measurements corresponded to the values at the level of the legs 1 and 7, which would be the opposite legs in a closed 12-element coil of this size. Coaxial elements similar to those described in U.S. Pat. No. 5,886,596 to Vaughan, Jr., hereby incorporated by reference were used.

Figure 1:
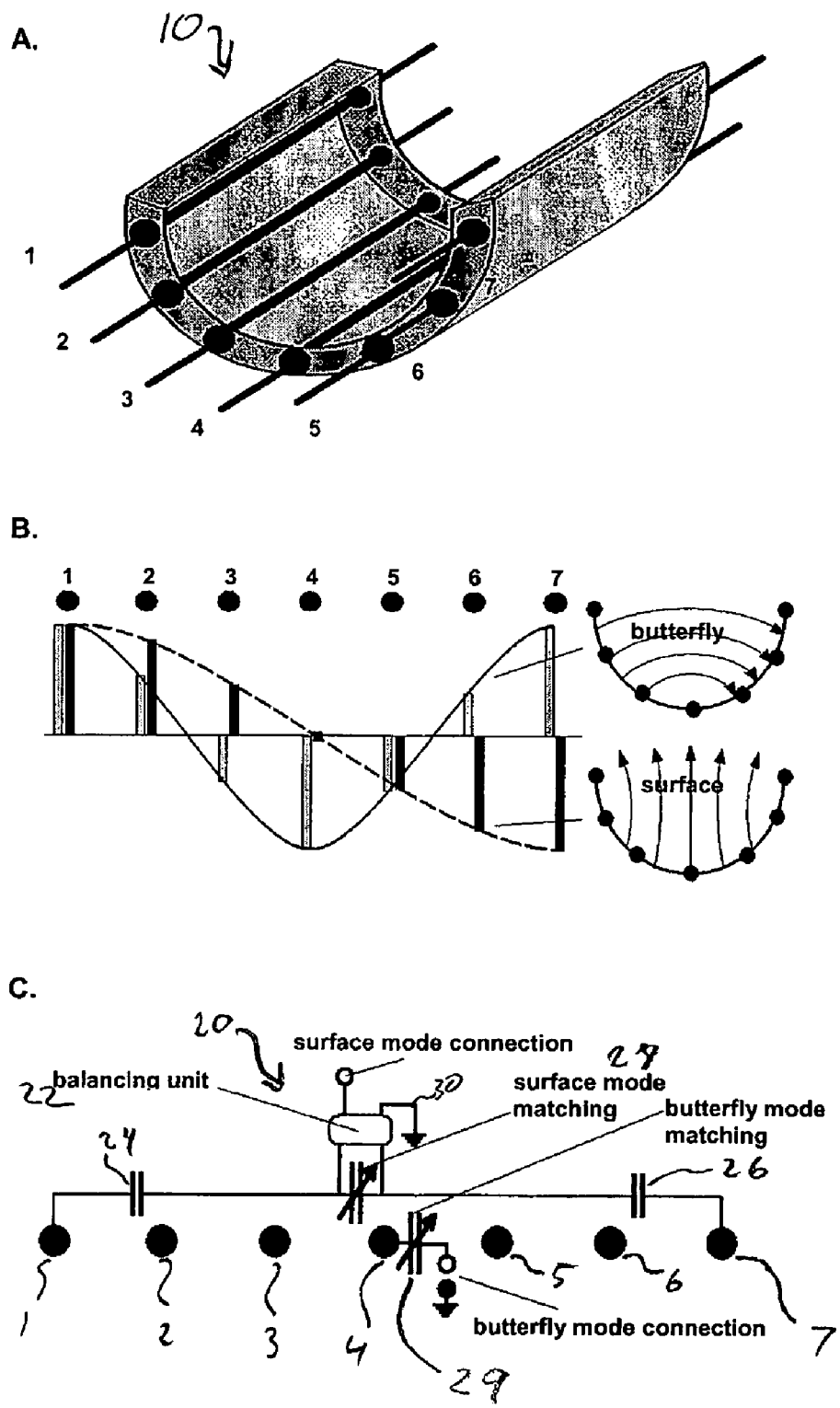
FIG. 1A is a perspective view of the overall coil geometry of an embodiment of the present invention.
FIG. 1B is a graph illustrating the theoretical current distributions for the surface and butterfly modes and their corresponding $B_1$ field patterns.
FIG. 1C is a schematic diagram of the driving circuit of the preferred embodiment of the present invention.

It can be seen from FIG. 1B that no current flows through the central leg (element 4) for the surface mode, while for the butterfly mode the current in this leg is large. Therefore, adjustments made in this element only shift the frequency of the butterfly mode, leaving the surface mode unperturbed. Frequencies of both modes are affected when symmetric elements on left and right sides are adjusted simultaneously since both modes support currents in those elements as can be seen in FIG. 1B. The elements were adjusted such that the frequency of the surface mode was 170.25 MHz, after which the frequency of the butterfly mode was brought down to the same value by increasing capacitance in the central element. Isolation between the modes depends on the relative capacitances in the symmetric elements and was corrected by asymmetrical adjustments in the elements one and seven, two and six, and three and five. These procedures were combined with measurements of distribution of currents in the TEM elements, which allowed us to minimize distortions due to element adjustments. Visualizing current distribution also helped identify both resonance modes. Thus, the coil tuning procedure includes three iterative steps: matching two resonance frequencies, adjusting isolation between the modes and correcting distribution of currents (symmetry). In an alternate embodiment, a nine-element coil can be used, wherein elements three and seven support no current in the butterfly mode. Because there is no current in these elements, adjusting elements three and seven only affects the surface mode, which therefore simplifies the tuning procedure.

The surface mode was driven using symmetrized, balanced, matching network 20 connected to elements 1 and 7, as shown in FIG. 1C. For the surface mode driving, it is critical to maintain 180 degrees phase shift between two driving points at legs 1 and 7. To ensure 180° phase shift between the currents in these elements, virtual ground was created at the center point between the connections by using a balun 22. Matching networks are known in the art, matching network 20 of the present invention comprising a balancing unit, or balun 22 connected to elements 1 and 7 via fixed matching capacitors 24 and 26 respectively, which are connected together by variable matching capacitor 28. Balun 22 is connected in parallel across variable matching capacitor 28 and is also connected to ground, 30. The butterfly mode was driven at the center leg in a manner used in closed TEM coils across variable matching capacitor 29 which is connected in series as illustrated in FIG. 1C. This type of matching permits isolation better than 23 dB between two quadrature modes.

Figure 2:
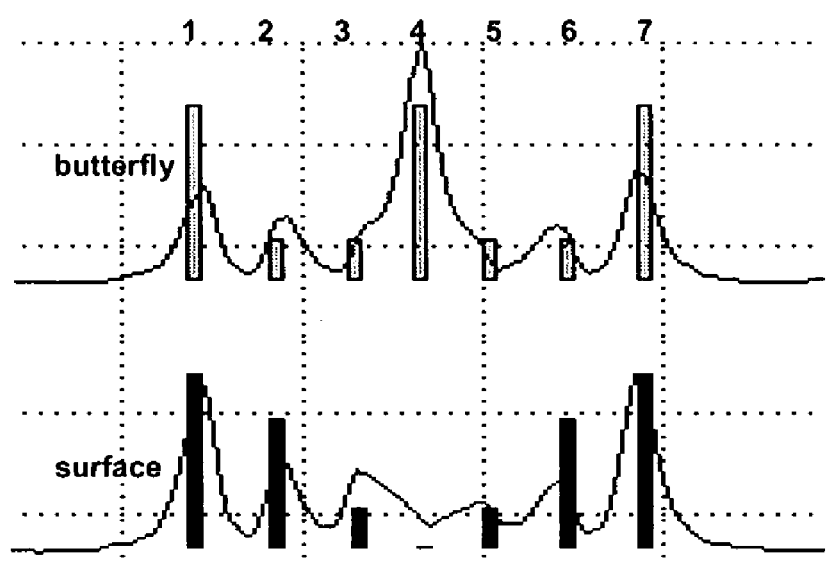
FIG. 2 is a graph illustrating the observed current distributions for the surface and butterfly modes obtained experimentally from an embodiment of the present invention.

The theoretical current distribution patterns shown in FIG. 1B became somewhat perturbed because of the adjustments made to bring the mode frequencies to the same value. The experimentally obtained values of currents squared in each element of the coil are presented for both modes in FIG. 2, which shows that the distribution for the surface mode roughly follows the theoretical pattern (the values of the (currents)$^2$ are shown), while for the butterfly mode the current in the central leg is relatively amplified.

The imaging experiments were performed on a 4 Tesla Varian Inova system (Varian Associated, Inc., Palo Alto, Calif.). A 16 cm diameter spherical phantom containing 50 mM KCl was studied. Transmission profiles ($B_1$ maps) were recorded with both the surface and the butterfly linear modes of the coil as well as with its quadrature mode using a technique based on flip angle measurements. In order to compare the coil's performance to the full-volume TEM coil (27 cm id, 20 cm length, 33 cm shield diameter) operating in the transmit/receive mode gradient-echo images were collected with each device. Images were also collected using the surface and the butterfly linear modes of the half-volume TEM coil to illustrate its ability to compensate the RF penetration artifact when coil is used in quadrature mode. The power corresponding to 90° flip angles produced by the half-volume TEM coil was determined by maximizing the signal obtained from the 1 cm coronal slices near the bottom of the phantom, where the signal was expected to be the strongest (the required power was 42 dB). A similar procedure using central transverse slices through the phantoms was utilized to determine the 90° flip angle power settings for the full-volume TEM coil (49 dB). The transmission power was then set to 60 degrees to obtain the $B_1$ maps and to 90° to record the images. Imaging parameters were as follows: repetition time=2 sec, field of view=20×20 cm with a 3 mm slice thickness and an in plane resolution of 128×128 voxels.

Figure 3:
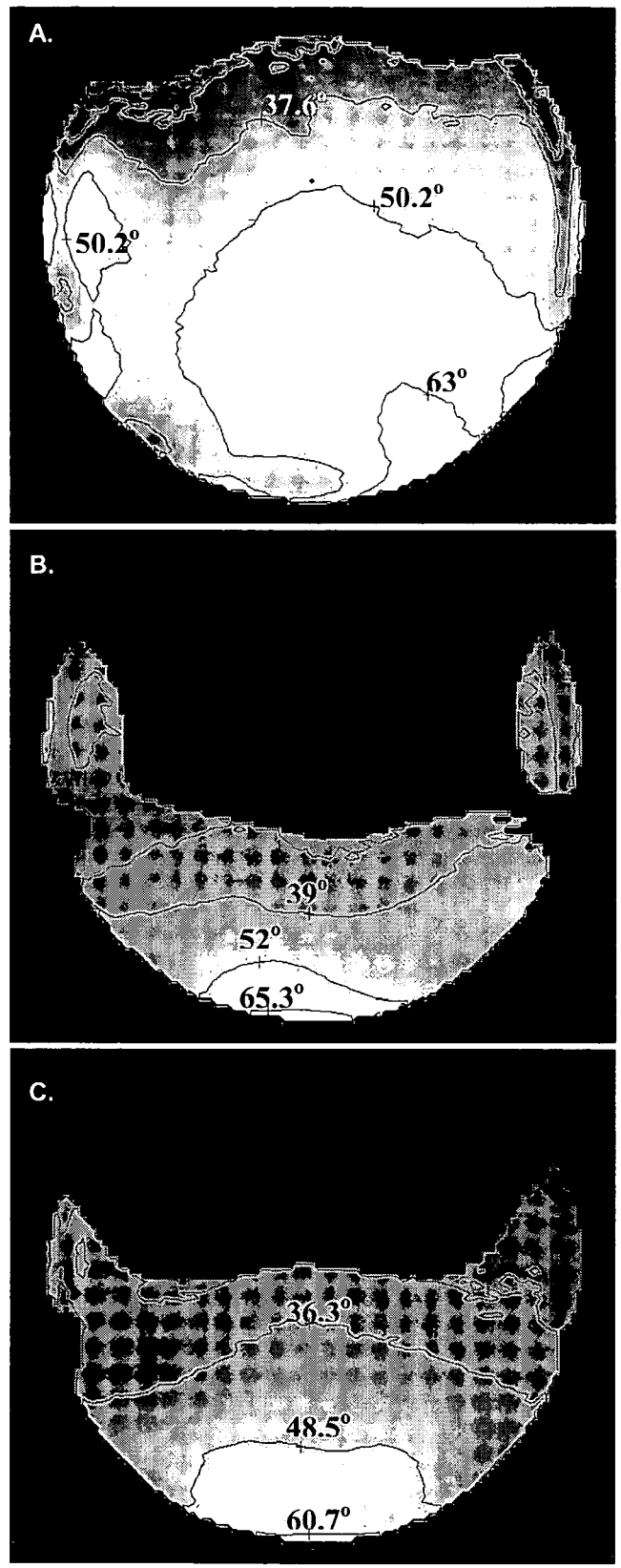
FIGS. 3A–C are magnetic field $B_1$ distribution maps in a spherical phantom for the surface, butterfly and quadrature modes respectively obtained experimentally from an embodiment of the present invention.

Magnetic field $B_1$ distribution maps in the spherical 50 mM KCL phantom for the surface, butterfly and quadrature modes obtained with the coil are presented in FIG. 3. The $B_1$ maps for the two linear modes are distorted due to the RF penetration artifact, which is observed in conducting objects imaged at high frequencies. The distortions are complementary to each other, leading to an effective self-compensation of the artifact when the coil is operated in quadrature, as can be seen from the symmetrical $B_1$ pattern of the quadrature mode presented in FIG. 3C.

Figure 4:
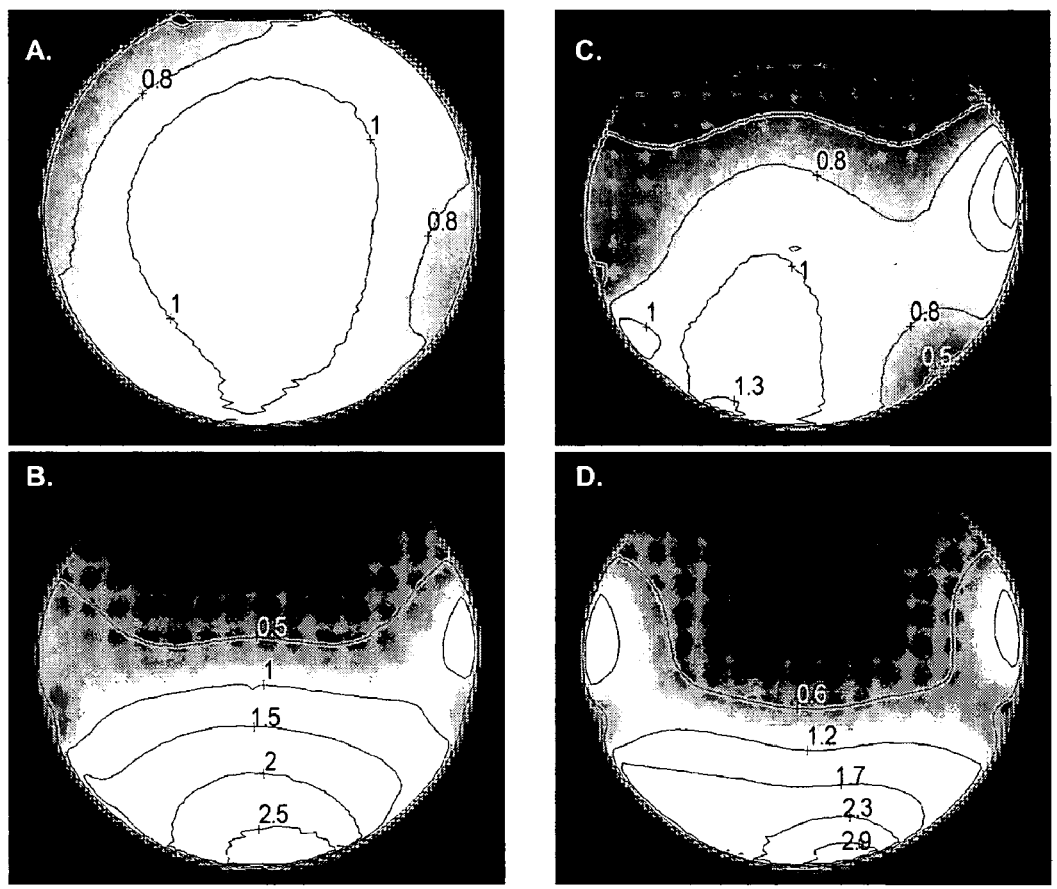
FIGS. 4A–D are gradient-echo images collected experimentally from an embodiment of the present invention.

FIG. 4 shows gradient-echo images collected with the half-volume TEM coil operating in the transmit/receive mode, and the full-volume transmit/receive TEM coil. The images were collected to compare the sensitivities of the devices. In addition, images collected with the surface and the butterfly modes of the half-volume TEM coil are provided to illustrate the RF penetration artifact, which distorts the images. As in the case of the $B_1$ maps, there are "hot" and "cold" spots in the linear surface and butterfly mode images that are complimentary to each other. Consequently, the artifact is suppressed when the modes are combined during quadrature operation of the coil. It should be noted that the "hot" and "cold" spots in the images and the $B_1$ maps taken with either linear mode do not coincide, but are rather formed on the opposite sides. This relates to the fact that while the $B_1$ maps follow transmission profiles of the devices, the images collected at high flip angles correspond to the receive profiles.

Figure 5:
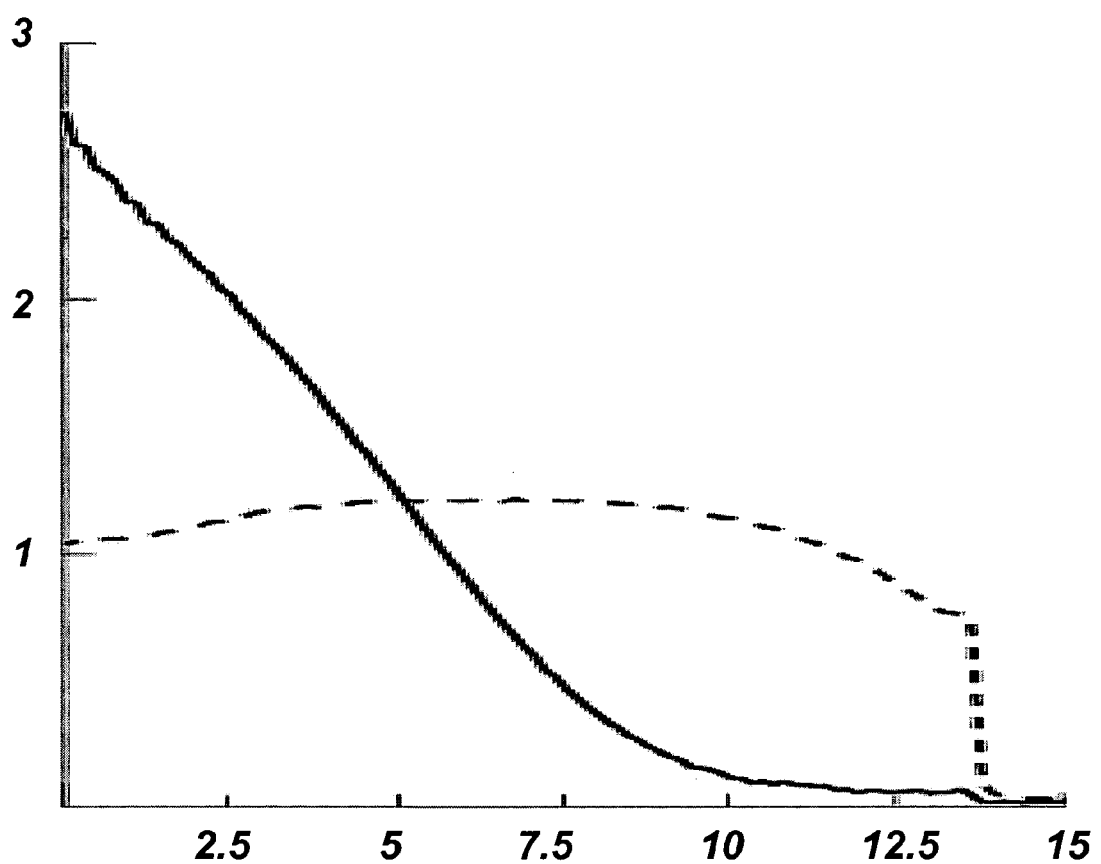
FIG. 5 Is a graph plotting the central slice profiles through the images (FIGS. 4A and B) recorded with an embodiment of the present invention (solid line), and a full-volume transmit/receive TEM coil of the prior art (dashed line) representing the sensitivities of the devices as a function of the distance from the edge of the phantom.

The sensitivity levels given in FIG. 4 are normalized to the maximum level for the volume TEM coil. To further illustrate the sensitivity differences of the three devices, the central slice profiles through the images are plotted in FIG. 5. The plots represent the sensitivities as a function of the distance from the coils, with the origin places at the edge of the phantom (the spacers between the phantom and the coils were approximately 1 cm in each case). The figure shows significant advantage of the half-volume TEM coil over the full-volume coil for the depths under approximately 5 cm. Thus, significant improvement in the SNR can be achieved by using the half-volume TEM without the need to use separate actively decoupled devices for transmission and reception and multiple receivers, as in the volume-transmit/surface coil array-receive combination.

Figure 6:
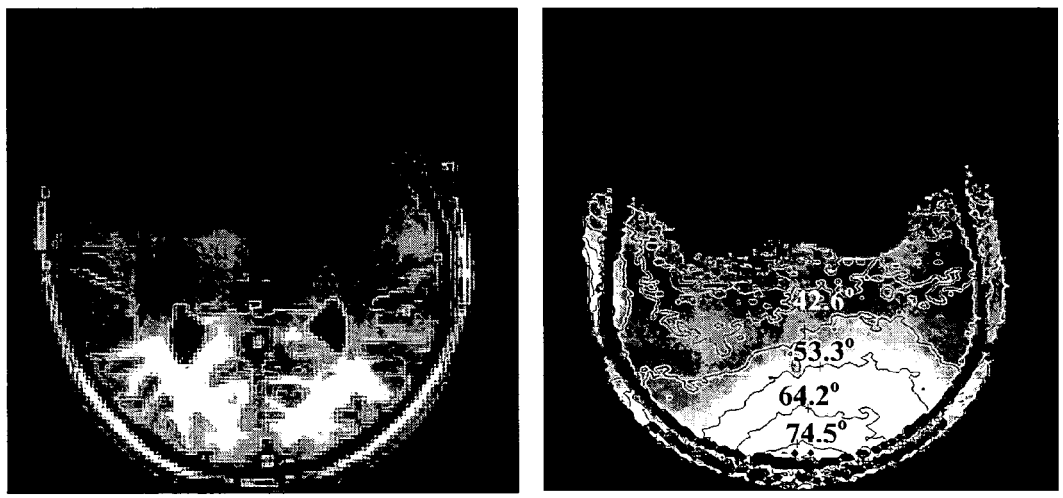
FIG. 6, left panel, is a human head gradient-echo image taken with an embodiment of the present invention.

This illustrates the capacity of the half-volume open TEM coil to improve the signal-to-noise ratio by both reducing the FOV and increasing the magnetic field filling factor relative to a closed TEM coil. The homogeneous region of the device is sufficiently large for it to be used as an efficient volume coil, while many of the conveniences and sensitivity advantages of the surface coils are retained. Additionally, the half-volume open TEM coil achieved the 90° flip angle excitation at 7 dB lower power than the full-volume transmit/receive TEM coil. This drastically reduces power deposition into the scanned objects, which is especially problematic for body coils at high frequencies. As shown in FIGS. 6A and 6B, a human head image and a $B_1$ map of the same slice, respectively, the occurrence of penetration artifacts are compensated for nicely by the open half-volume quadrature coil of the above-disclosed embodiment. Constructing efficient high-frequency body coils, therefore, becomes possible using the half-volume open TEM technology presented herein, which will provide lower power deposition, higher sensitivity and easier access than conventional full-volume coils.

What is claimed is:

1. An open volume quadrature transverse electromagnetic coil comprising:
    a plurality of inductively coupled resonant transmission line elements adapted to be driven to resonate in a first mode and a second mode; and
    a quadrature driver circuit operatively associated with said transmission line elements for driving said coil in said first mode and said second mode simultaneously, wherein one of said first and second modes is associated with at least one nodal point in said coil, at least one of said transmission line elements located at one of said at least one nodal point such that the mode associated with said nodal point induces no current in said at least one transmission line element, and wherein the other of said first and second modes is driven from said element in said nodal point.

2. The device of claim 1 wherein said first mode is a surface mode and said second mode is a butterfly mode.

3. The device of claim 2 having a first element and a last element, wherein said coil is driven in said surface mode in such a manner to maintain approximately a 180 degree phase shift between said first and last elements.

4. The device of claim 3 wherein said surface mode and said butterfly mode are be driven and tuned independently.

5. The device of claim 3 wherein said quadrature driver circuit includes a symmetrized matching network for driving said coil in the surface mode.

6. The device of claim 4 wherein said butterfly mode is driven at one of said at least one elements located within said nodal point of the surface mode.

7. The device of claim 2 wherein said coil is comprised of seven elements, having a first and last element and a center element, said center element located within said at least one nodal point.

8. The device of claim 7 wherein said center element is located within a nodal point associated with said surface mode.

9. The device of claim 8 wherein said butterfly mode is driven from said center element.

10. The device of claim 2 wherein said coil is comprised of nine elements, having a center element located within said at least one nodal point.

11. The device of claim 10 wherein said center element is located within a nodal point associated with said surface mode.

12. The device of claim 11 wherein at least two of said nine elements other than said center element are located within nodal points associated with said butterfly mode.

* * * * *